(12) United States Patent
Dasgupta et al.

(10) Patent No.: US 11,218,133 B2
(45) Date of Patent: Jan. 4, 2022

(54) FILM BULK ACOUSTIC RESONATOR (FBAR) DEVICES FOR HIGH FREQUENCY RF FILTERS

(71) Applicant: INTEL CORPORATION, Santa Clara, CA (US)

(72) Inventors: Sansaptak Dasgupta, Hillsboro, OR (US); Bruce A. Block, Portland, OR (US); Paul B. Fischer, Portland, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 16/327,705

(22) PCT Filed: Sep. 30, 2016

(86) PCT No.: PCT/US2016/054690
§ 371 (c)(1),
(2) Date: Feb. 22, 2019

(87) PCT Pub. No.: WO2018/063294
PCT Pub. Date: Apr. 5, 2018

(65) Prior Publication Data
US 2019/0190488 A1 Jun. 20, 2019

(51) Int. Cl.
*H03H 9/205* (2006.01)
*H03H 9/17* (2006.01)
(Continued)

(52) U.S. Cl.
CPC ............ *H03H 9/205* (2013.01); *H03H 3/04* (2013.01); *H03H 9/02007* (2013.01);
(Continued)

(58) Field of Classification Search
CPC .... H03H 9/205; H03H 9/02007; H03H 9/175; H03H 3/04
See application file for complete search history.

(56) References Cited

U.S. PATENT DOCUMENTS 10,581,398 B2 * 3/2020 Gibb ................. H01L 41/22
10,666,220 B2 * 5/2020 Kida ................. H03H 9/568
(Continued)

FOREIGN PATENT DOCUMENTS

WO 2018063294 A1 4/2018

OTHER PUBLICATIONS

International Search Report and Written Opinion received for PCT/US2016/054690, dated May 24, 2017. 14 pages.
International Preliminary Report on Patentability received for PCT/US2016/054690, dated Apr. 2, 2019. 10 pages.

*Primary Examiner* — Samuel S Outten
(74) *Attorney, Agent, or Firm* — Scwabe, Williamson & Wyatt P.C.

(57) ABSTRACT

Techniques are disclosed for forming integrated circuit film bulk acoustic resonator (FBAR) devices having multiple resonator thicknesses on a common substrate. A piezoelectric stack is formed in an STI trench and overgrown onto the STI material. In some cases, the piezoelectric stack can include epitaxially grown AlN. In some cases, the piezoelectric stack can include single crystal (epitaxial) AlN in combination with polycrystalline (e.g., sputtered) AlN. The piezoelectric stack thus forms a central portion having a first resonator thickness and end wings extending from the central portion and having a different resonator thickness. Each wing may also have different thicknesses from one another. Thus, multiple resonator thicknesses can be achieved on a common substrate, and hence, multiple resonant frequencies on that same substrate. The end wings can (Continued)

have metal electrodes formed thereon, and the central portion can have a plurality of IDT electrodes patterned thereon.

22 Claims, 11 Drawing Sheets

(51) Int. Cl.
*H03H 9/02* (2006.01)
*H03H 3/04* (2006.01)
*H03H 3/02* (2006.01)

(52) U.S. Cl.
CPC ....... *H03H 9/175* (2013.01); *H03H 2003/025* (2013.01); *H03H 2003/0435* (2013.01); *H03H 2009/02173* (2013.01)

(56) References Cited

U.S. PATENT DOCUMENTS

| | | | |
|---|---|---|---|
| 2007/0139141 A1 | 6/2007 | Knollenberg et al. | |
| 2008/0129412 A1 | 6/2008 | Osone et al. | |
| 2015/0266725 A1 | 9/2015 | Baskaran | |
| 2015/0333248 A1* | 11/2015 | Moulard | H01L 41/083 333/133 |
| 2016/0065172 A1* | 3/2016 | Shealy | H03H 3/02 310/348 |
| 2016/0079958 A1 | 3/2016 | Burak | |
| 2016/0352304 A1* | 12/2016 | Kadota | H03H 9/14538 |
| 2017/0085247 A1* | 3/2017 | Ruby | H03H 9/02574 |
| 2017/0366163 A1* | 12/2017 | Kishimoto | H03H 9/0561 |

* cited by examiner

FILM BULK ACOUSTIC RESONATOR (FBAR) DEVICES FOR HIGH FREQUENCY RF FILTERS

CROSS-REFERENCE TO RELATED APPLICATIONS

This patent application is a U.S. National Phase Application under 35 U.S.C. § 371 of International Application No. PCT/US2016/054690, filed on Sep. 30, 2016, the entire contents of which is hereby incorporated by reference herein.

BACKGROUND

Radio frequency (RF) filters are an important component in modern communication systems. With the growing number of bands and modes of communications, the number of RF filters in a mobile device front end can multiply quickly. Resonators, such as film bulk acoustic resonators (FBAR), sometimes referred to as thin-FBAR (TFBAR), are some components that are used to make RF filters. An FBAR generally includes a piezoelectric material located between two electrodes and acoustically isolated from the surrounding medium. A typical front end must filter out multiple operating frequencies, which necessitates multiple distinct RF filters, generally one RF filter for each operating frequency to be filtered.

Figure 1:
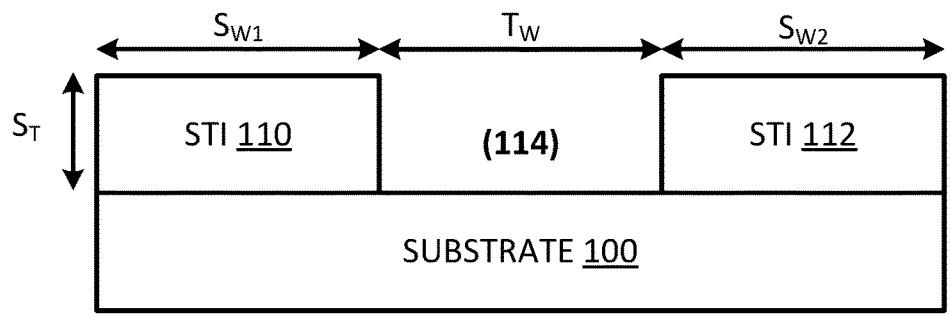
FIG. 1 illustrates an example integrated circuit structure including a substrate and having shallow trench isolation (STI) material deposited thereon to form a trench, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming integrated circuit resonator devices using piezoelectric films that form a structure capable of operating at multiple resonant frequencies on a single substrate. In some cases, the piezoelectric stack of the resonator device may include an epitaxial III-V layer such as an aluminum nitride (AlN) or other group III material-nitride (III-N) compound film (e.g., any combination of one or more of gallium, indium, and aluminum with nitrogen) grown as a part of a III-V material stack, although any other suitable piezoelectric materials can be used. According to an embodiment, STI material is deposited on a substrate material and then selectively etched so as to form a trench between two distinct areas of STI material. Use of a piezoelectric group III-V material stack grown in the trench and then overgrown onto the STI material results in a structure having a thick central portion and thinner wings. Each wing extends laterally out from each end of the central portion and the wings are suspended over the substrate in accordance with an embodiment of the present disclosure. The piezoelectric stack can include a first low-temperature single crystal Aluminum Nitride (AlN) layer and a second high-temperature single crystal AlN layer deposited on the first low-temperature AlN layer, according to an embodiment. The piezoelectric stack can include a first single crystal low-temperature single crystal Aluminum Nitride (AlN) layer, a second high-temperature single crystal AlN layer deposited on the first low-temperature AlN layer and a third polycrystalline AlN layer sputtered on the second high-temperature AlN layer, according to another embodiment. The piezoelectric stack can include a first low-temperature single crystal Aluminum Nitride (AlN) layer, a second polycrystalline AlN layer and a third high-temperature single crystal AlN layer deposited on top of the low-temperature AlN layer and the second polycrystalline AlN layer, according to still another embodiment. A metal electrode can be deposited on the piezoelectric stack, and the structure can be flipped and bonded to a pre-formed substrate structure, in accordance with various embodiments of the present disclosure. Numerous variations and configurations will be apparent in light of this disclosure.

General Overview

RF filters continue to be a major factor in the costs of RF front end and the total integrated circuit (IC) area available, particularly in light of 5G mobile telecommunication technology on the horizon. Aluminum nitride (AlN) has been a common piezoelectric film material for FBARs in the RF filter space. However, due to processing constraints, polycrystalline AlN is typically deposited via a sputtering technique after back electrode processing. As will be appreciated in light of this disclosure, sputtered AlN alone is of significantly poorer quality compared to single crystal AlN that is deposited via epitaxial techniques, such as, for example, metal-organic chemical vapor deposition (MOCVD) and molecular-beam epitaxy (MBE). One potential drawback associated with purely sputtered piezoelectric material layers includes difficulty in controlling thickness of the sputtered piezoelectric layer(s).

Thus, and in accordance with one or more embodiments of the present disclosure, techniques are provided for forming integrated circuit FBAR devices using epitaxially grown piezoelectric elements. The piezoelectric group III-V material stack (a III-N material stack to be more precise) is deposited in a trench defined by the STI material formed on a substrate and the piezoelectric material is overgrown onto the STI material to form a piezoelectric stack, in accordance with an embodiment of the present disclosure. Due to the overgrowth-based process, the piezoelectric stack has a central portion and wing portions extending laterally from opposing ends of the central portion. This creates at least two different distinct thicknesses on one substrate in accordance with an embodiment of the present disclosure. In some embodiments, the piezoelectric group III-V material stack is formed using multiple deposition processes, including low and high temperature epitaxial depositions of single crystal materials. In some example cases, the piezoelectric group III-V material stack forming process includes non-epitaxial deposition (e.g. sputtering) at certain points in the stack, such as over certain portions of the STI material, as will be appreciated in light of this disclosure. The piezoelectric stack can have a metal contact deposited on a top surface thereof such that the piezoelectric stack and metal contact structure can be flipped and bonded to a pre-formed substrate structure. In this manner, the metal contact deposited on the top surface of the piezoelectric stack becomes a bottom electrode for the piezoelectric material once inverted. Also once inverted, the initial substrate material can be removed to reveal the piezoelectric stack material, and metal electrodes can be deposited thereon to form appropriate resonator structures, as will be appreciated in light of the present disclosure.

In some embodiments, the FBAR devices may be used in RF filters or for other suitable applications, such as for duplexers, for multiplexers, for sensors, in conjunction with power amplifiers (PAs), or for low noise amplifiers (LNAs), for example. In some embodiments, the piezoelectric element of the FBAR structure may be epitaxial AlN or any other suitable epitaxial piezoelectric material, such as zinc oxide (ZnO) or lead zirconium titanate (PZT), or other III-V compounds, such as gallium nitride (GaN), indium nitride (InN), or other III-N materials, for example, as will be apparent in light of the present disclosure. As variously used herein, III-V compounds/materials include at least one group III element (e.g., aluminum, gallium, indium, boron, thallium) and at least one group V element (e.g., nitrogen, phosphorus, arsenic, antimony, bismuth). In some embodiments, group III element-nitride (III-N) compounds/materials may be particularly well-suited for the FBAR piezoelectric element, due to III-N materials having high bandgaps and other desirable properties. III-N materials, as variously used herein, include a compound of one or more group III materials (e.g., aluminum, gallium, and/or indium), with nitrogen. Accordingly, III-N materials/compounds as variously used herein include, but are not limited to, GaN, InN, AlN, AlInN, AlGaN, InGaN, and AlInGaN. In some embodiments, the use of a piezoelectric material deposited in a trench and overgrown onto STI material results in the ability to create multiple resonator thicknesses on a common substrate, as will be further appreciated in light of this disclosure. To this end, a single substrate can be used to have vastly different resonant frequencies, depending on the various piezoelectric group III-V material stack thicknesses provided. Moreover, in some embodiments, at least three resonator devices are defined, including one resonant device at the central portion and one at each wing on opposing ends of the central portion.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name a few suitable example analytical tools. In particular, such tools may indicate a structure or device configured with an FBAR structure including an epitaxial piezoelectric film as variously described herein. For example, in some embodiments, an epitaxial AlN piezoelectric film may be detected between a top and bottom electrode of an FBAR structure. In some such embodiments, the thickness and/or film quality of the FBAR piezoelectric layer may be indicative that the techniques variously described herein have been used. For example, use of the techniques variously described herein can result in an FBAR including a piezoelectric film (e.g., epitaxial AlN) having multiple thicknesses, each thickness being less than, for instance, 1 micron, or less than 500 nm, or less than 200 nm, or less than 100 nm, or less than 50 nm, or less than 25 nm, or some other suitable maximum thickness as will be apparent in light of the present disclosure. To this end, note that the thicknesses can be set based on the desired frequency ranges to be filtered. Another tell-tale sign of the techniques provided herein is that an angled lateral face will result at a terminus of the winged ends that are formed during the lateral epitaxy overgrowth process, according to some embodiments. This face is angled according to the crystallographic structure and orientation of single crystal material used as the piezoelectric material, in some embodiments. The angle can vary from one embodiment to the next depending on the materials used, but in some example cases is in the range of 40° and 85°, such as between 55° and 62°.

Therefore, the techniques variously described herein can be used to form higher quality FBAR structures and thus higher quality RF filters that are able to have more than one resonant frequency on a same substrate or a preformed substrate structure. Numerous benefits, configurations, and variations will be apparent in light of this disclosure.

Architecture and Methodology

FIGS. 1-7 illustrate example integrated circuit structures defining an FBAR device including a piezoelectric stack having at least two different resonator thicknesses on a common substrate, in accordance with an embodiment of the present disclosure. In some embodiments, the techniques for forming FBAR structures having a piezoelectric stack include initially growing STI material on a substrate and selectively etching to form a trench, depositing the piezoelectric stack material in the trench and overgrowing the piezoelectric stack material laterally onto the STI material. In some such embodiments, the stack can include various III-V materials epitaxially grown on a group IV material substrate (e.g., a silicon (Si), silicon carbide (SiC), germanium (Ge), or SiGe substrate), a sapphire substrate, or any other suitable material substrate. For example, in one specific embodiment the III-V material stack may include a first low-temperature epitaxial Aluminum Nitride (AlN) layer and a second high-temperature epitaxial AlN layer deposited on the first low-temperature AlN layer, as will be described in more detail herein. In another specific example, the piezoelectric stack may include a first low-temperature epitaxial AlN layer, a second high-temperature epitaxial AlN layer deposited on the first low-temperature AlN layer, and a third AlN layer sputtered on the second high-temperature AlN layer. In still another specific example, the piezoelectric stack may include a first low-temperature epitaxial AlN layer, a second polycrystalline AlN layer and a third high-temperature epitaxial AlN layer deposited on top of the low-temperature AlN layer and the second polycrystalline AlN layer. As will be appreciated, reference herein to an epitaxial layer refers to that layer as being single crystal (sometimes called monocrystalline). Such single crystal layers are distinct from, for example, amorphous or polycrystalline layers.

FIG. 1 illustrates an example integrated circuit structure including a substrate and having STI material deposited thereon to form a trench, in accordance with an embodiment of the present disclosure. A substrate 100 is provided, which can be a Silicon (111) wafer for example, although other group IV bulk substrate materials can be employed, as will be appreciated in light of the present disclosure. The STI material is blanket deposited on the substrate 100 and then patterned and etched into two areas, including first STI material 110 and second STI material 112. As can be further seen, depositing and selectively etching the STI material forms a trench 114 between the first STI material 110 and second STI material 112, in accordance with an embodiment of the present disclosure. The STI material can be deposited and etched according to any appropriate technique, as will be appreciated. The STI material can be, for example, Silicon Dioxide ($SiO_2$), Silicon Nitride (SiN), Aluminum Oxide ($Al_2O_3$), porous $SiO_2$ or SiN or $Al_2O_3$, Tungsten (W), Molybdenum (Mo), or another appropriate material. Any suitable deposition process may be used for the STI deposition and the STI material may be selected based on the material of substrate 100 (e.g., to provide appropriate isolation and/or passivation), in some embodiments. For example, in the case of a Si substrate 100, STI material 110, 112 may selected to be silicon dioxide ($SiO_2$) or silicon nitride (SiN), in accordance with an example embodiment of the present disclosure.

In accordance with an example embodiment, the STI material 110 can be have an approximate width ($S_{W1}$) of 100 to 200 micrometers (μm), the STI material 112 can have an approximate width ($S_{W2}$) of 100 to 200 μm and the trench 114 can have an approximate width ($T_W$) of 100 to 200 μm. Although STI material 110, STI material 112 and the trench 114 are shown as having approximately equal widths, this is not necessary, and in some cases the STI material 110, the STI material 112 and the trench 114 may each have varying widths, or in some cases, the width may be identical or nearly identical. The height of the STI material and trench may vary as well, but will effectively define the air gap between the underlying substrate and the overgrowth or wing portions of the piezoelectric material stack, as will be appreciated in light of this disclosure. The trench can be sized to facilitate overgrowth. In a more general sense, the dimensions of the STI and trench can vary from one embodiment to the next and the present disclosure is not intended to be limited to any particular dimensional scheme.

Figure 2A:
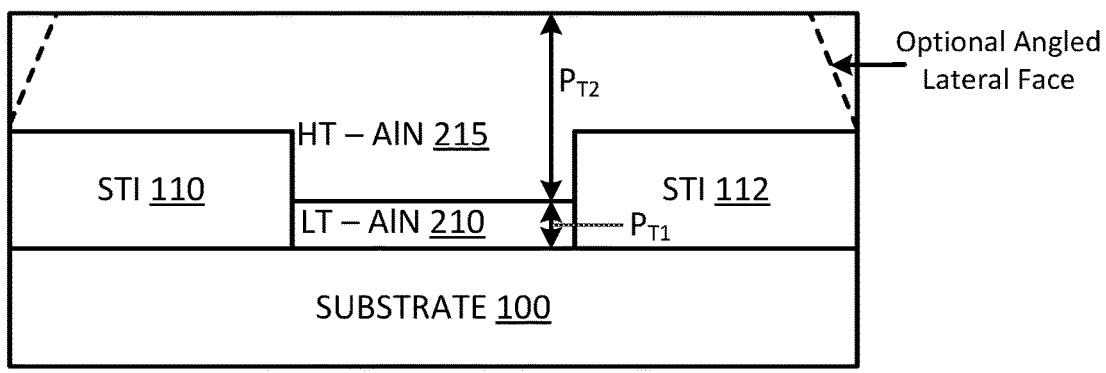
FIGS. 2A-2C illustrate example integrated circuit structures including a piezoelectric stack deposited in the trench formed by the STI material and laterally overgrown onto the STI material to form a central portion and opposing end wings, according to different techniques of deposition, in accordance with various embodiments of the present disclosure.
Figure 2B:
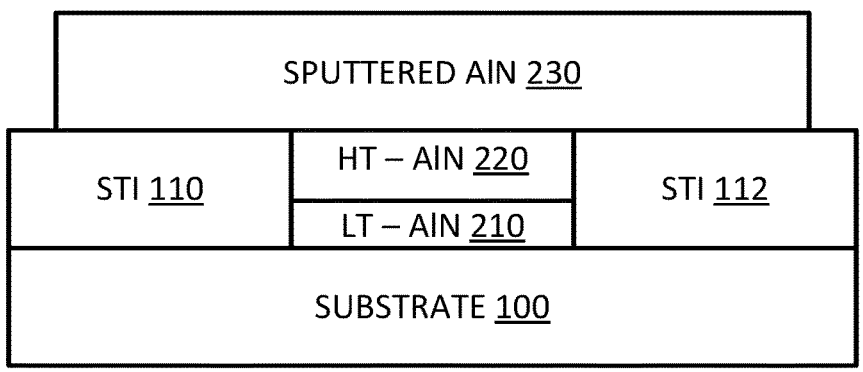
Figure 2C:
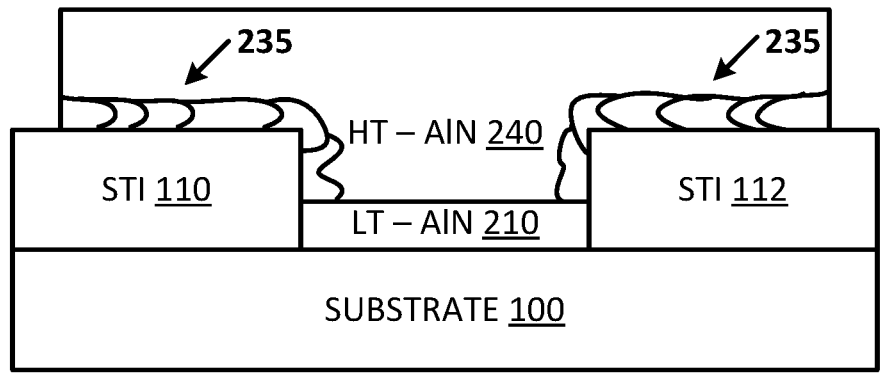

FIGS. 2A-2C illustrate example integrated circuit structures including a piezoelectric stack deposited in the trench and laterally overgrown onto the STI material to form a central portion and opposing end wings, according to different techniques of deposition, in accordance with various embodiments of the present disclosure. The piezoelectric stack includes the central portion and the first wing extends from one end of the central portion, and the second wing that extends from another opposing end of the central portion, for example. The first wing has a first thickness that is approximately equal to a second thickness of the second wing, and the central portion has a third thickness that differs from the first thickness and the second thickness, to thereby allow for multiple resonant frequencies to be achieved on a single substrate.

FIG. 2A illustrates an example integrated circuit structure including a piezoelectric stack deposited in a trench and laterally overgrown onto the STI material to achieve two or more differing thicknesses of piezoelectric material on a substrate, in accordance with an embodiment of the present disclosure. The piezoelectric stack includes a first low-temperature epitaxial AlN layer 210 and a second high-temperature epitaxial AlN layer 215 deposited on the first low-temperature AlN layer 210. The low-temperature (LT) AlN layer 210 is deposited within the trench (114) and the high-temperature (HT) AlN layer 215 is deposited in the trench on the LT-AlN layer and also overgrown onto the STI material 110, 112 to form a central portion of the piezoelectric stack and wings on opposing ends of the central portion. The AlN layers 210, 214 are monocrystalline and deposited by appropriate epitaxial techniques, such as metal organic chemical vapor deposition (MOCVD), molecular beam epitaxy (MBE) or hydride vapor phase epitaxy (HYPE). For high crystalline quality, the first layer is a LT AlN layer 210, where the low temperature is approximately 700-950 degrees Celsius (C), and then a high temperature AlN layer 215 (greater than 950 C) is used to grow the remaining crystalline AlN layer. The LT layer 210 traps dislocation defects and initiates a better nucleation on the Si substrate for AlN Wurzite crystal. It will be appreciated in light of the present disclosure that, although the piezoelectric stack is disclosed as including AlN, any group III-V semiconductor material can be implemented, or any variant thereof, such as Aluminum Scandium Nitride (AlScN).

In accordance with an embodiment, the layer 210 can have a thickness ($P_{T1}$) of approximately 100 nanometers (nm) to 500 nm, and the layer 215 can have a thickness ($P_{T2}$) of approximately 1 μm to 2 μm. The thickness(es) on the wing portions of layer 215 is determined by the desired resonant frequency (or frequencies) of resonator, and can be set accordingly during the highly controllable epitaxial growth process. Note that while both wings are shown as having the same thickness, in other example embodiments, one wing may have a first thickness (to provide one resonant frequency) and the other wing may have a second thickness (to provide a yet another resonant frequency). Further note that, in some embodiments, an angled lateral face will result at a terminus of the winged ends that are formed during the lateral epitaxy overgrowth process, if the overgrowth isn't contained by, for example, a trench or wall. This optional angled lateral face is shown in profile with a dashed line in FIG. 2A, and is angled according to the crystallographic structure and orientation of single crystal material used as the piezoelectric material, in accordance with some embodiments. The angle can vary from one embodiment to the next depending on the materials used, but in some example cases is in the range of 40° and 85°, such as between 55° and 62°. Numerous configurations will be apparent in light of this disclosure.

In some embodiments, the piezoelectric stack can be replaced with a single group III-V semiconductor material rather than a stack of layers of group III-V semiconductor material. For example, the piezoelectric stack in some embodiments can include a uniform AlN layer formed in the trench and overgrown onto the STI material 110, 112 to form the central portion and the opposing end wing portions.

FIG. 2B illustrates an example integrated circuit structure including a piezoelectric stack deposited in a trench and laterally overgrown onto the STI material to achieve two or more thicknesses of piezoelectric material on a substrate, in accordance with another embodiment of the present disclosure. As can be seen, the trench between the STI material 110 and the STI material 112 is filled in by first depositing a single crystal first low-temperature (LT) AlN layer 210, and then depositing a second layer of high-temperature (HT) AlN 220 on the first layer 210. As can be further seen in this example embodiment, a polycrystalline AlN layer 230 is then sputtered on the single crystal AlN layers 210, 220. A device cross-section in STEM would show the morphology illustrated in FIG. 2B having polycrystalline AlN 230 sputtered on the epitaxial single crystal high-temperature AlN 220 and low-temperature AlN 210. The layers 210, 220 can be deposited in the trench and over the STI material using any appropriate epitaxy technique, such as MOCVD, MBE or HVPE. The sputtered AlN layer 230 can be sputtered on the high-temperature AlN layer 220 and the STI material 110, 112 according to any standard sputtering technique.

FIG. 2C illustrates an example integrated circuit structure including a piezoelectric stack deposited in a trench and laterally overgrown onto the STI material to achieve two or more thicknesses of piezoelectric material on a substrate, in accordance with still another embodiment of the present disclosure. As can be seen, the trench is filled in with a first low-temperature (LT) AlN layer 210, and a polycrystalline AlN 235 is selectively sputtered onto the STI material 110, 112, which can be done during or after the deposition of the LT-AlN layer 210 (depending on process chamber capability and compatibility of the two distinct deposition processes).

A high-temperature (HT) AlN layer 240 is then deposited on the polycrystalline AlN layer 235 and the LT-AlN layer 210. The AlN layers 210, 240 can be deposited according to any appropriate epitaxial technique, such as MOCVD, MBE or HPVE.

Figure 3:
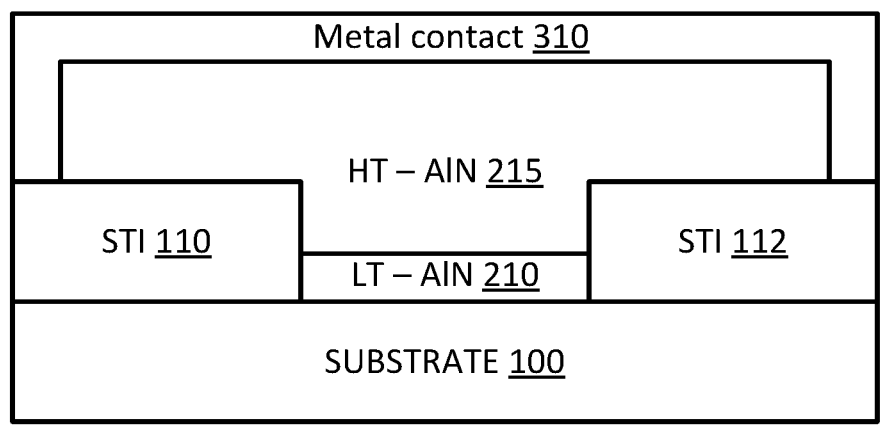
FIG. 3 illustrates an example integrated circuit structure after a metal contact has been deposited on a top surface of the piezoelectric stack, in accordance with an embodiment of the present disclosure.

FIG. 3 illustrates an example integrated circuit structure after a metal contact has been deposited on a top surface of the piezoelectric stack, in accordance with an embodiment of the present disclosure. As shown, the metal contact 310 is patterned on the HT-AlN 215 and overfilled down to the STI material 110, 112. The metal contact 310 can be Tungsten (W), Molybdenum (Mo), Titanium Nitride (TiN), or other appropriate metal in accordance with an embodiment of the present disclosure. The metal contact 310 can be provided on the piezoelectric stack according to any appropriate deposition technique, such as atomic layer deposition (ALD). The thickness of the metal contact 310 can be, for example, in the range of 100 to 200 nm, although other thicknesses can be implemented in accordance with the techniques disclosed herein.

Figure 4:
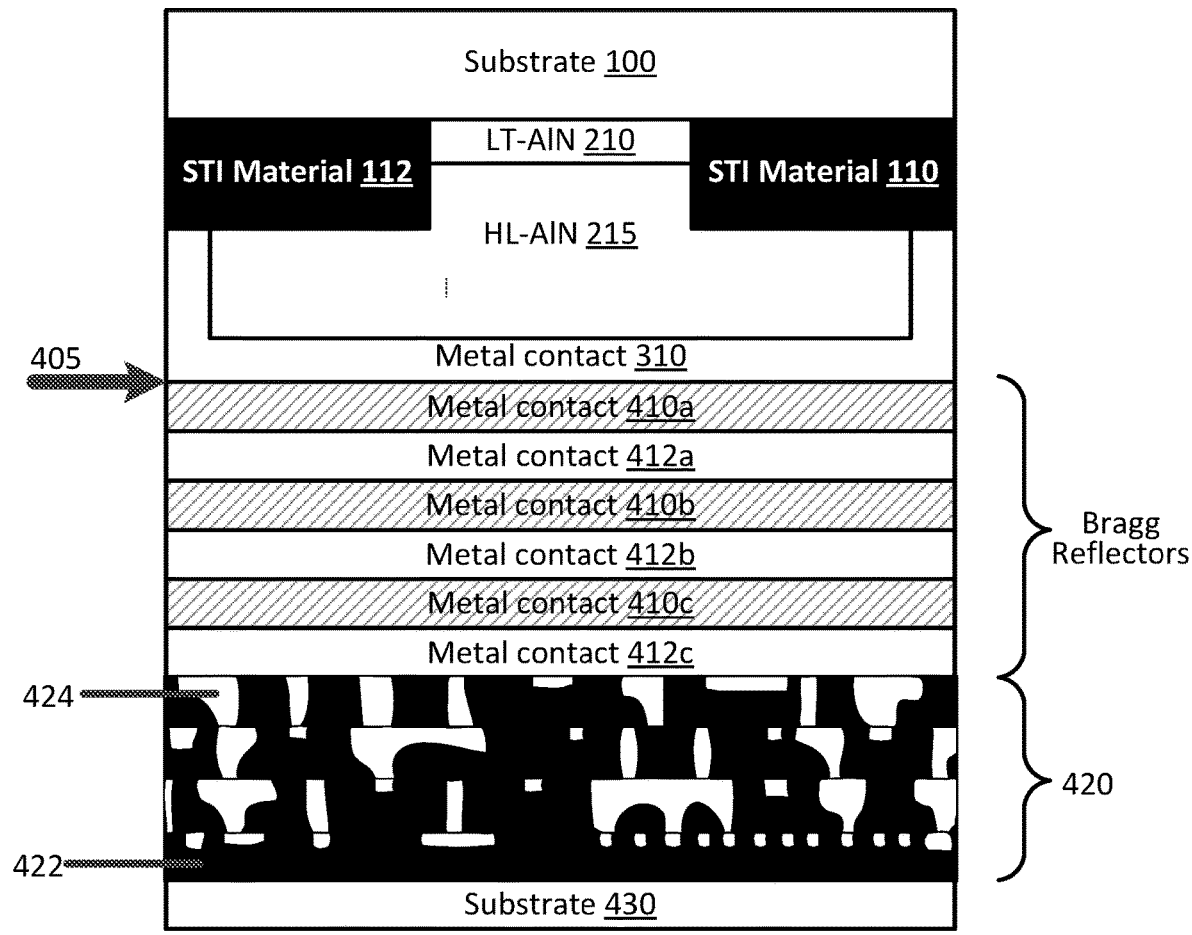
FIG. 4 illustrates an example integrated circuit structure after the piezoelectric stack and metal contact structure of FIG. 3 has been flipped and bonded to a preformed substrate structure, in accordance with an embodiment of the present disclosure.

FIG. 4 illustrates an example integrated circuit structure after the piezoelectric stack and metal contact structure of FIG. 3 has been flipped and bonded to a preformed substrate structure, in accordance with an embodiment of the present disclosure. As shown, the metal electrode 310 that was deposited on the top surface of the piezoelectric stack is now the bottom metal contact for the resonator structures of the piezoelectric stack. The metal contact 310 is bonded to a preformed substrate structure including a plurality of Bragg reflectors 410a, 412a, 410b, 412b, 410c and 412c, appropriate metal interconnects 420 and a second substrate 430. The metal contact 310 can be bonded to the Bragg reflector 410a at location 405 by any appropriate metal bonding technique. The Bragg reflectors can be made of repeated stacks of W or Mo (for Bragg reflectors 410a, 410b and 410c, for example) and SiO$_2$ (for Bragg reflectors 412a, 412b and 412c, for example). The thickness of each layer in the Bragg reflectors is typically λ/4, where λ is obtained from the chosen frequency of the resonator element, which is the thickness of the overhanging AlN on the STI material, in accordance with an example embodiment. The metal interconnects 420 can include ILD (inter-layer dielectric) material 422 (shown as the dark material in layer 422) and metal 424 (shown as the light material in layer 420), such as for transistors and the appropriate metal interconnects. The substrate 430 can be any appropriate substrate material, such as Si, or can also be a prefabricated Si chip or a CMOS (Complementary Metal Oxide Semiconductor) wafer, as will be appreciated.

Figure 5:
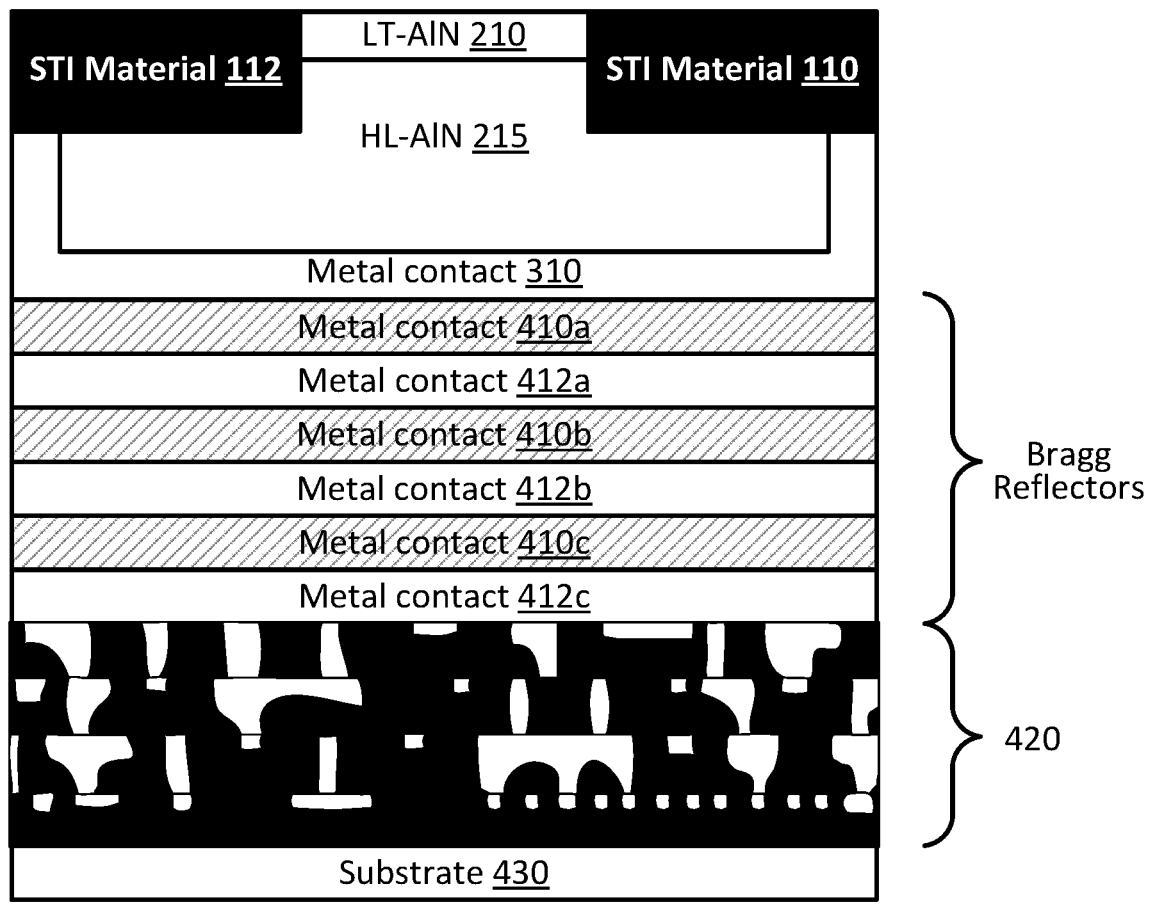
FIG. 5 illustrates an example integrated circuit structure after the substrate has been removed to reveal the piezoelectric stack and STI material, in accordance with an embodiment of the present disclosure.

FIG. 5 illustrates an example integrated circuit structure after the substrate has been removed to reveal the piezoelectric stack and STI material, in accordance with an embodiment of the present disclosure. As shown, the first substrate material (100 in FIG. 4) has been removed, for example by polish or grind processing, to reveal the piezoelectric stack, comprised of LT-AlN layer 210 and HT-AlN layer 215 in accordance with an example embodiment. The piezoelectric stack can be any appropriate group III-V semiconductor material, as will be appreciated in light of this disclosure, and is not limited to the LT-AlN layer 210 and HT-AlN layer 215.

Figure 6:
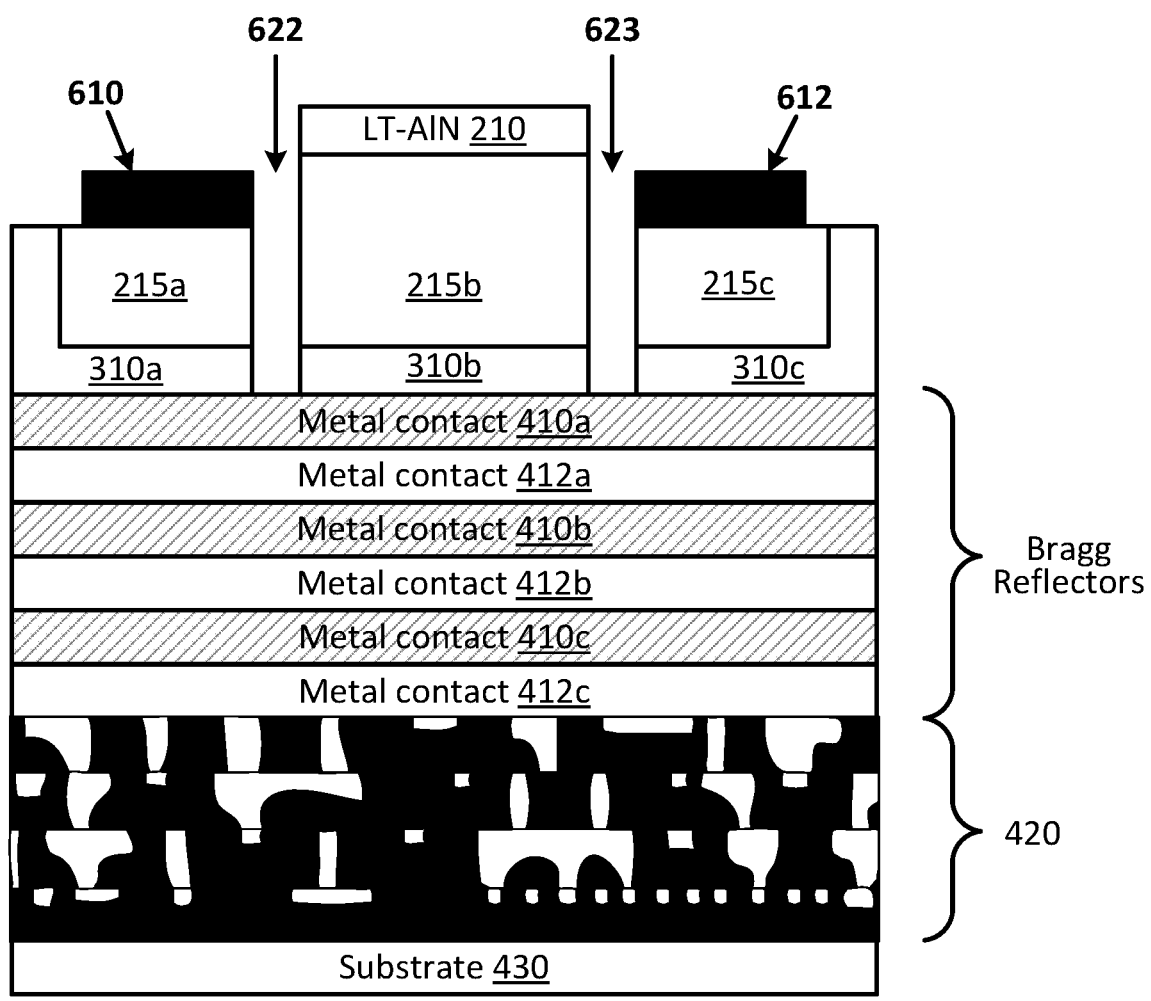
FIG. 6 illustrates an example integrated circuit structure after the STI material has been removed and top electrodes have been fabricated on the wing portion of the piezoelectric stack and isolation etch has been performed, in accordance with an embodiment of the present disclosure.

FIG. 6 illustrates an example integrated circuit structure after the STI material has been removed and top electrodes have been fabricated on the wing portion of the piezoelectric stack and isolation etch has been performed, in accordance with an embodiment of the present disclosure. The STI material (110, 112) has been removed, which can be performed via wet or vapor phase etch, for example. As shown, the structure in FIG. 6 provides the piezoelectric stack now defining three separate layers 215a, 215b and 215c. A top electrode 610 is deposited on a first layer 215a of the piezoelectric stack and a second electrode 612 is deposited on a third layer 215c of the piezoelectric stack, in accordance with an example embodiment. An isolation etch can be performed to provide a cavity 622 that defines the first layer 215a from the second layer 215b, and an isolation etch can also be performed to provide a cavity 623 between the second layer 215b and the third layer 215c, such that there are three separate layers defined from a same piezoelectric stack. The cavities 622, 623 can be filled in with an appropriate insulating material, such as $SiO_2$, not shown in FIG. 6, to isolate the layers 215a, 215b and 215c from each other. The first layer 215a and third layer 215c form two bulk acoustic wave (BAW) filters with a resonant frequency given by the equation $$f = \frac{V}{2t}$$

where V is the acoustic velocity in AlN and t is the thickness of the layer. The top metal electrodes 610 and 612 can have an approximate thickness of 100 to 200 nm.

Figure 7:
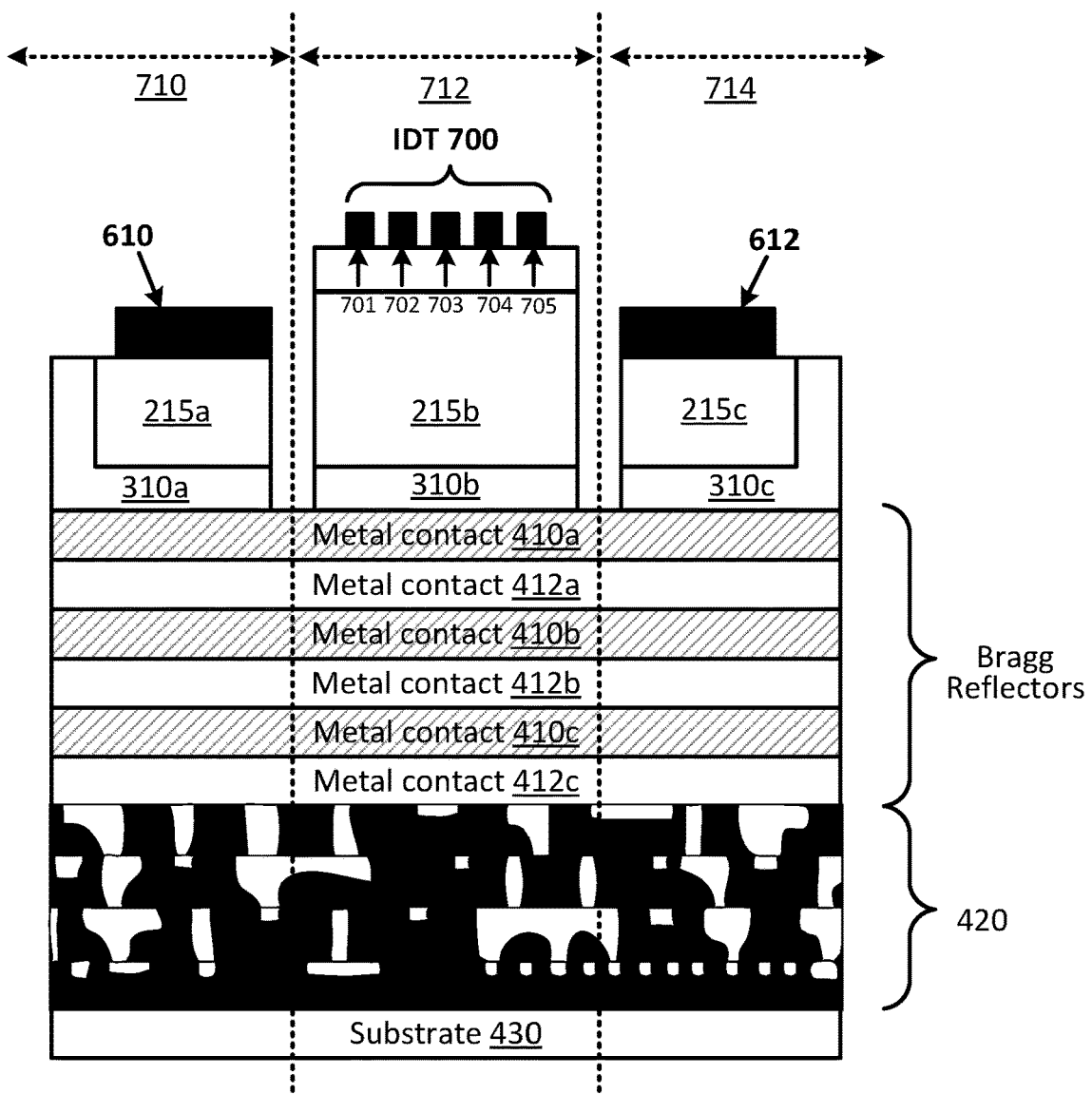
FIG. 7 illustrates an example integrated circuit structure after a plurality of IDT electrodes have been fabricated on the central portion of the piezoelectric stack, in accordance with an embodiment of the present disclosure.

FIG. 7 illustrates an example integrated circuit structure after a plurality of IDT electrodes have been fabricated on the central portion of the piezoelectric stack, in accordance with an embodiment of the present disclosure. As shown, the second (central) layer 215b has a plurality of IDT electrodes 700 patterned thereon. The plurality of interdigitated (IDT) electrodes 700, including individual electrodes 701, 702, 703, 704 and 705, are patterned on a top surface of the central portion of the piezoelectric stack, now defined as second layer 215b, in accordance with an embodiment of the present disclosure. The metal electrodes 701, 702, 703, 704 and 705 can be electrode material similar to that used for electrodes 610, 612, such Tungsten (W), Molybdenum (Mo), Titanium Nitride (TiN), or other appropriate metal in accordance with an embodiment of the present disclosure. Note that the structure forms a first resonator device 710 at the first end wing, a second resonator device 712 at the central portion, and a third resonator device 714 at the opposing second end wing. Further recall that each of these resonators can have a unique resonant frequency.

Figure 7A:
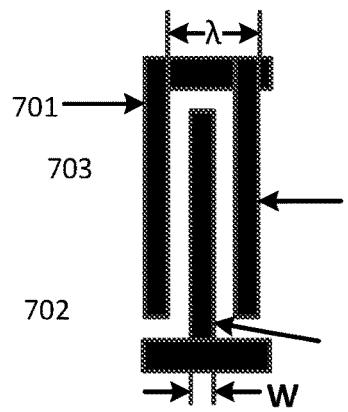
FIG. 7A illustrates a top view of the IDT electrodes of FIG. 7, in accordance with an example embodiment of the present disclosure.

FIG. 7A illustrates a top view of the IDT electrodes of FIG. 7, in accordance with an example embodiment of the present disclosure. This shows the top view of the IDT electrodes 701, 702 and 703 shown in cross-section in FIG. 7. The filter frequency can be defined by the width (W) and spacing of the IDT electrodes, where the width is equal to the resonant frequency (λ) of interest divided by 4, in accordance with an example embodiment of the present disclosure.

Figure 8:
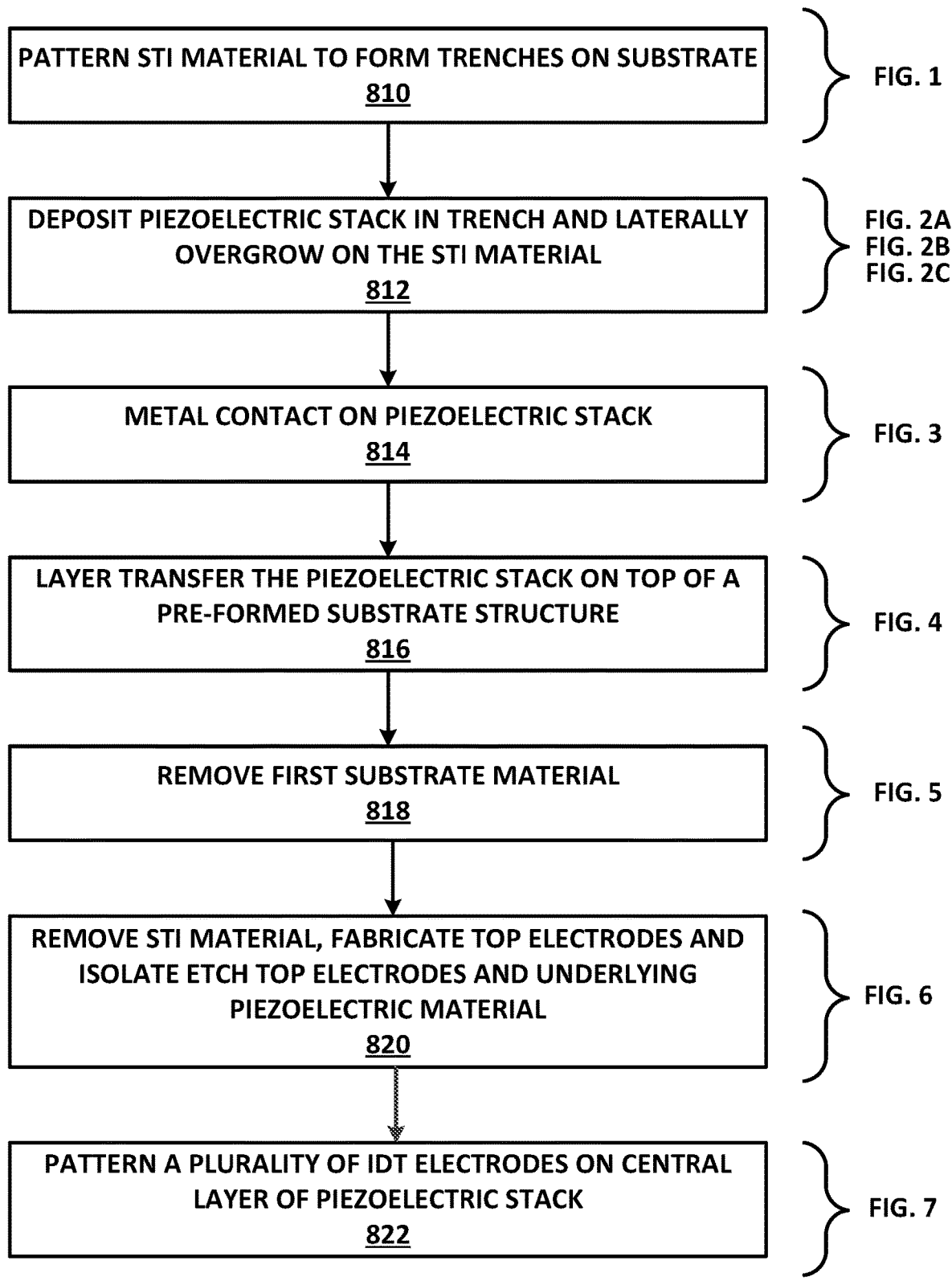
FIG. 8 illustrates a methodology for forming an integrated circuit according to FIGS. 1-7, in accordance with an example embodiment of the present disclosure.

FIG. 8 illustrates a methodology for forming an integrated circuit according to FIGS. 1-7, in accordance with an example embodiment of the present disclosure. At 810, STI is patterned to form trenches on a substrate, in accordance with an example embodiment of the present disclosure. Refer, for example, to FIG. 1 showing an example integrated circuit structure showing STI material patterned on a substrate to form a trench. At 812, a piezoelectric stack of III-N material(s) is deposited in the trench and laterally overgrown onto the STI material, in accordance with an embodiment of the present disclosure. Refer, for example, to FIG. 2A, 2B or 2C, each illustrating one example structure having a group III-V piezoelectric stack formed in the trench and overgrown laterally onto the STI material, in accordance with the techniques disclosed herein.

Figure 9A:
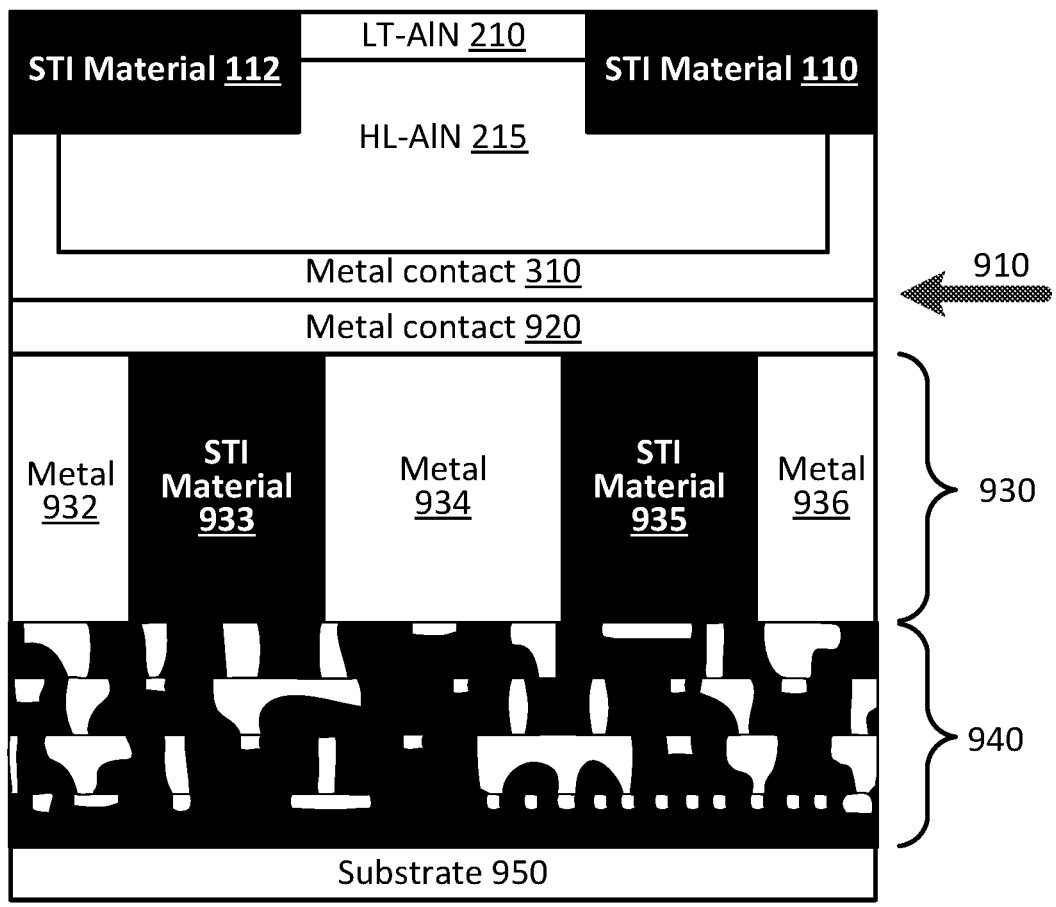
FIG. 9A illustrates an example integrated circuit structure including a piezoelectric material and metal contact deposited on a pre-formed substrate structure that includes STI material and additional metal contacts, in accordance with another example embodiment of the present disclosure.
Figure 9B:
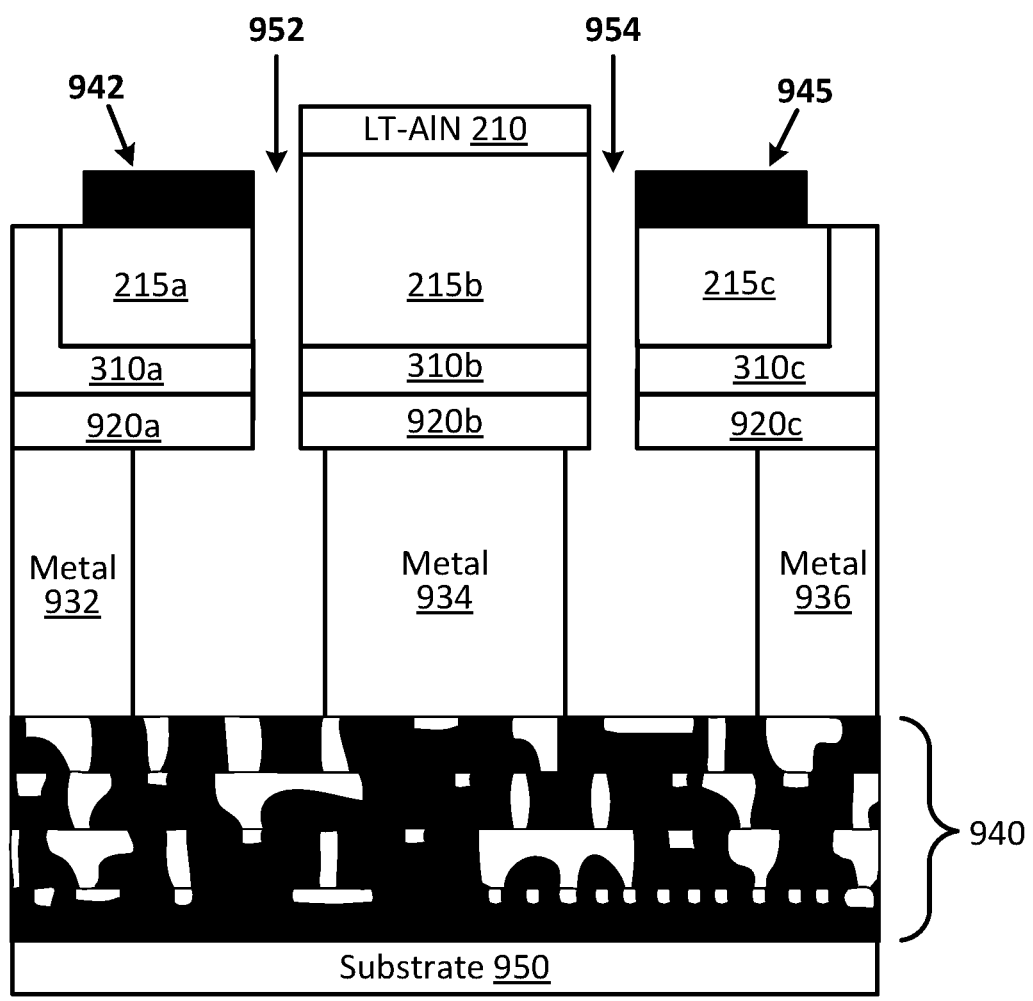
FIG. 9B illustrates an example integrated circuit structure of FIG. 9A, with the STI material removed, revealing three separate resonator structures each capable of having its own resonant frequency, in accordance with an embodiment of the present disclosure.
Figure 10:
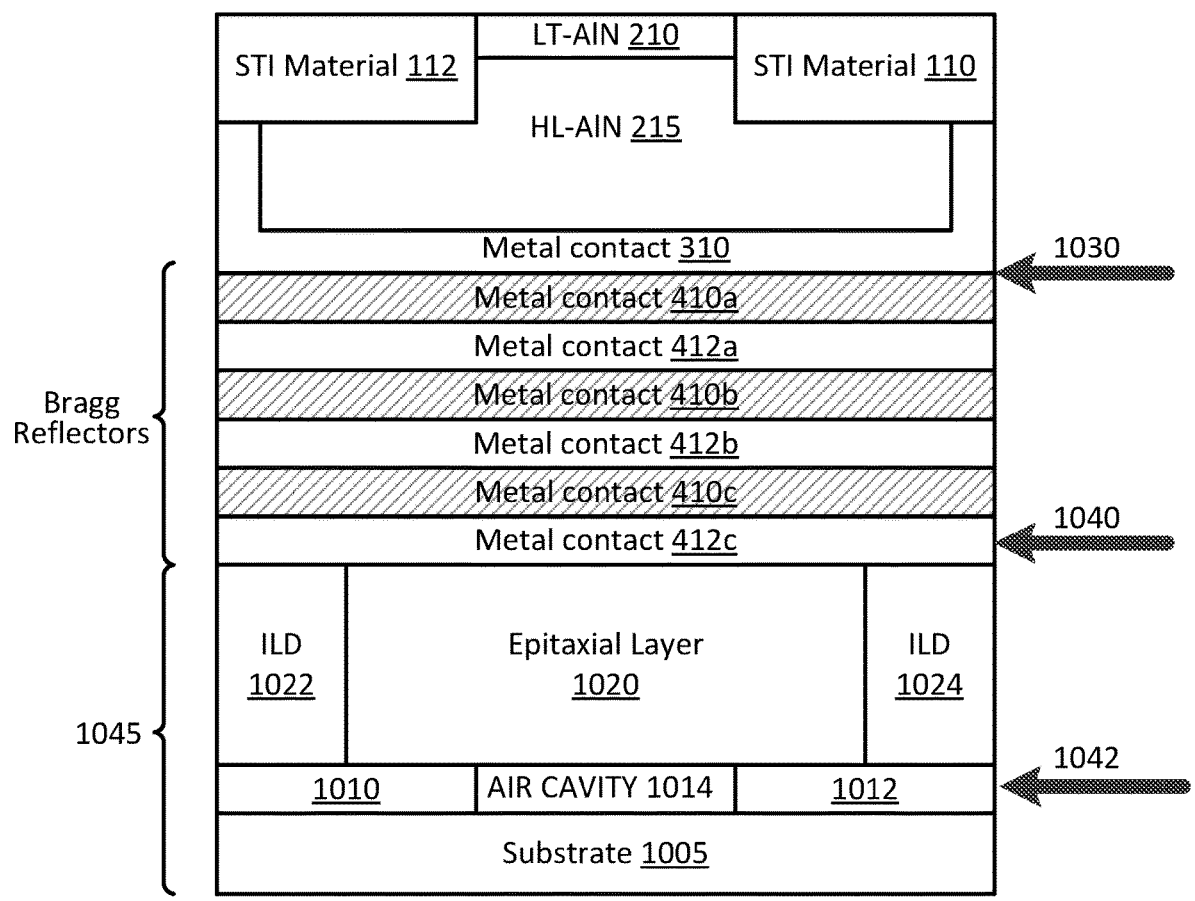
FIG. 10 illustrates an example integrated circuit structure including a piezoelectric material and metal contact deposited on a pre-formed substrate that includes a film bulk acoustic resonator (FBAR) device, in accordance with another embodiment of the present disclosure.

At 814, a metal contact is a metal contact is deposited on a top surface of the piezoelectric stack, in accordance with an example embodiment of the present disclosure. Refer, for example, to FIG. 3 showing an example integrated circuit structure showing the metal contact deposited on the piezoelectric stack. At 816, the piezoelectric stack with metal contact deposited thereon are inverted (i.e. flipped over 180-degrees) and layer transferred on top of a pre-formed substrate structure. An example integrated circuit structure showing the piezoelectric stack with metal contact layer transferred on top of a pre-formed substrate is shown in FIG. 4, for example. FIGS. 9A, 9B and 10 illustrate other example pre-formed substrates onto which the piezoelectric stack with metal contact can be layer transferred.

At 818, the first substrate material (for example, substrate 100 in FIG. 4) is removed, in accordance with an example embodiment of the present disclosure. Refer, for example, to FIG. 5 showing an example integrated circuit structure with the first substrate material 100 removed, thereby exposing the piezoelectric stack. In this manner, a piezoelectric stack is provided that has a thicker central portion and thinner opposing wings formed on a common metal contact, as will be appreciated in light of the present disclosure.

At 820, the STI material (for example, STI material 110, 112 in FIG. 5) is removed, top electrodes are fabricated and etch isolation is performed. Refer, for example, to FIG. 6 showing an example integrated circuit structure where the STI material has been removed, top electrodes have been fabricated on the outer wing sections of the piezoelectric stack, and isolation etch has been performed. The isolation etch provides three separate layers of a same piezoelectric stack material, to thereby form three separate resonator structures.

At 822, a plurality of IDT electrodes is patterned on the central layer (for example, layer 215b in FIGS. 6 and 7) of the piezoelectric material. Refer, for example, to FIG. 7 showing an integrated circuit structure after the plurality of IDT electrodes have been patterned on the central layer 215b. The resulting structure includes a first resonator device formed by the first metal contact and first end of the piezoelectric stack, a second resonator device formed by the second metal contacts and the second end of the piezoelectric stack; and a third resonator device formed by the IDT electrodes, central layer of the piezoelectric stack.

FIG. 9A illustrates an example integrated circuit structure including a piezoelectric material and metal contact deposited on a pre-formed substrate structure that includes STI material and additional metal contacts, in accordance with another example embodiment of the present disclosure. In this example embodiment, the metal contact 310 is bonded (at 910) to a pre-formed substrate structure including a metal contact 920, and STI and metal post layer 930, metal interconnects 940 and a base substrate 950. The STI and metal post layer 930 can include a plurality of metal posts 932, 934 and 936, patterned in STI material 933, 935. The metal interconnects 940 can include ILD (inter-layer dielectric) material (shown as the dark material in layer 940) and metal (shown as the light material in layer 940), such as for transistors and the appropriate metal interconnects.

FIG. 9B illustrates an example integrated circuit structure of FIG. 9A, with the STI material removed, revealing three separate resonator structures each capable of having its own resonant frequency, in accordance with an embodiment of the present disclosure. By providing STI material between the metal posts 932, 934, 936, the STI material within the layer 930 can be removed, as well as STI material 110, 112, to provide the resulting structure in FIG. 9B. The metal contacts 942, 945, can be formed on the layers 215a, 215b, respectively, of the piezoelectric stack. An isolation etch process can be performed to provide cavities 952, 954, which can extend fully down to the cavity where the STI material 933, 935 was previously deposited. Thereafter, although not shown in FIG. 9B, a plurality of IDT electrodes can be deposited on the LT-AlN layer 210, in accordance with the techniques of the present disclosure. Additionally, although not shown in FIG. 9B, the cavities 952, 954 can be filled in with an appropriate material, such as $SiO_2$ provide the desired isolation between the layers 215a, 215b and 215c.

FIG. 10 illustrates an example integrated circuit structure including a piezoelectric material and metal contact deposited on a pre-formed substrate that includes a film bulk acoustic resonator (FBAR) device, in accordance with another embodiment of the present disclosure. The piezoelectric stack with metal contact 310 is layer transferred onto a pre-formed substrate material at 1030, which includes a plurality of Bragg reflectors 410a, 412a, 410b, 412b, 410c and 412c, and an epitaxial layer 1020 surrounding by ILD material 1022, 1024, over electrodes 1010, 1012, which form an air cavity 1014 therebetween, over a substrate 1005. The metal contact 412c (Bragg reflector) acts as a top electrode for the bottom FBAR structure 1045. The electrodes 1010, 1012 act as a bottom electrode 1042 for the FBAR structure 1045. The STI material 110, 112 can be removed and the piezoelectric stack can be fabricated in accordance with the techniques disclosed herein to arrive at a top FBAR structure having at least three resonator structures each having a different resonant frequency, and a bottom FBAR structure having a fourth resonant frequency.

Example System

Figure 11:
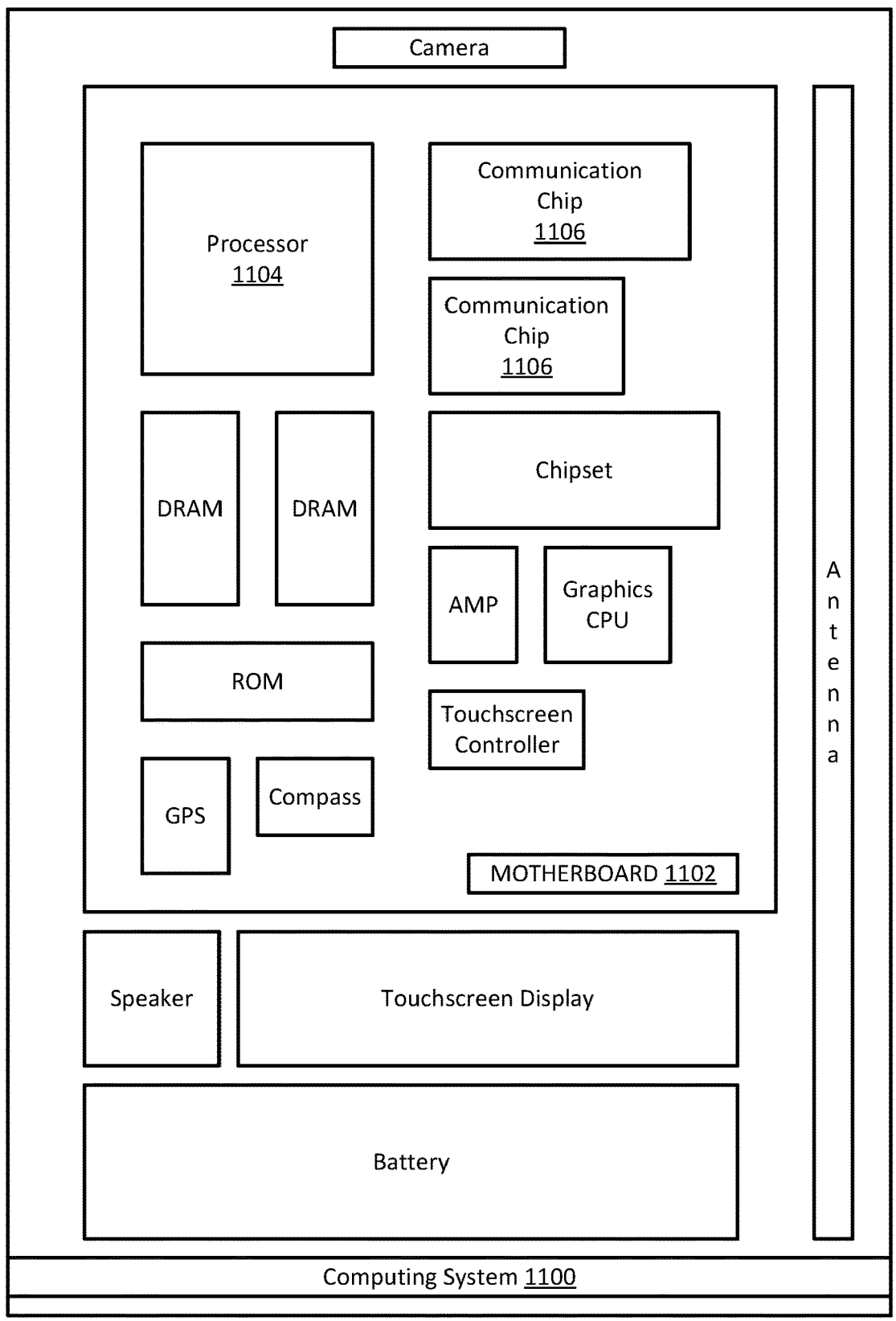
FIG. 11 illustrates a computing system implemented with integrated circuit structures or devices formed using the techniques disclosed herein, in accordance with an embodiment of the present disclosure.

FIG. 11 illustrates a computing system 1100 implemented with integrated circuit structures or devices formed using the techniques disclosed herein, in accordance with an example embodiment. As can be seen, the computing system 1100 houses a motherboard 1102. The motherboard 1102 may include a number of components, including, but not limited to, a processor 1104 and at least one communication chip 1106, each of which can be physically and electrically coupled to the motherboard 1102, or otherwise integrated therein. As will be appreciated, the motherboard 1102 may be, for example, any printed circuit board, whether a main board, a daughterboard mounted on a main board, or the only board of system 1100, etc.

Depending on its applications, computing system 1100 may include one or more other components that may or may not be physically and electrically coupled to the motherboard 1102. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1100 may include one or more integrated circuit structures or devices formed using the disclosed techniques in accordance with an example embodiment. In some embodiments, multiple functions can be integrated into one or more chips (e.g., for instance, note that the communication chip 1106 can be part of or otherwise integrated into the processor 1104).

The communication chip 1106 enables wireless communications for the transfer of data to and from the computing system 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others. In some embodiments, communication chip 1106 may include one or more FBAR structures as variously described herein (e.g., FBAR including a relatively thin epitaxial AlN piezoelectric element), and such FBAR structures may be included in one or more RF filters. Further, such RF filters may be configured to be high frequency filters (e.g., operating at greater than 1, 2, 3, 4, or 5 GHz). Further still, such RF filters may be included in the RF front end of computing system 1100 and they may be used for 5G wireless standards or protocols, for example.

The processor 1104 of the computing system 1100 includes an integrated circuit die packaged within the processor 1104. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1106 also may include an integrated circuit die packaged within the communication chip 1106. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1104 (e.g., where functionality of any chips 1106 is integrated into processor 1104, rather than having separate communication chips). Further note that processor 1104 may be a chip set having such wireless capability. In short, any number of processor 1104 and/or communication chips 1106 can be used. Likewise, any one chip or chip set can have multiple functions integrated therein.

In various implementations, the computing device 1100 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit resonator device including a substrate; a first resonator structure over a first portion of the substrate, the first resonator structure including a first piezoelectric layer on a first bottom metal contact, the first piezoelectric layer having a first thickness, and a first top metal contact on the first piezoelectric layer; and a second resonator structure over a second portion of the substrate, the first resonator structure including a second piezoelectric layer on a second bottom metal contact, the second piezoelectric layer having a second thickness that is thicker than the first thickness of the first piezoelectric layer, and a second top metal contact on the second piezoelectric layer; wherein the first piezoelectric layer and the second piezoelectric layer include a group III-V single crystal semiconductor material.

Example 2 includes the subject matter of Example 1, wherein the first piezoelectric layer and the second piezoelectric layer include a same group III-V single crystal semiconductor material that includes at least one of: Aluminum Nitride (AlN) and Aluminum Scandium Nitride (AlScN).

Example 3 includes the subject matter of any of Examples 1-2, wherein the first piezoelectric layer and the second piezoelectric layer each include a first Aluminum Nitride (AlN) layer and a second AlN layer on the first AlN layer, the second AlN layer being distinct from the first AlN layer.

Example 4 includes the subject matter of any of Examples 1-3, wherein the first piezoelectric layer and the second piezoelectric layer each includes a first single crystal Aluminum Nitride (AlN) layer, a second single crystal AlN layer on the first AlN layer, and a third polycrystalline AlN layer on the second single crystal AlN layer, each of the first, second, and third AlN layers being distinct from one another.

Example 5 includes the subject matter of any of Examples 1-4, wherein the first piezoelectric layer and the second piezoelectric layer each includes a first single crystal Aluminum Nitride (AlN) layer, a second polycrystalline AlN layer, and a third single crystal AlN layer on top of both the first single crystal AlN layer and the second polycrystalline AlN layer.

Example 6 includes the subject matter of any of Examples 1-5, further including a third resonator structure over a third portion of the substrate, the third resonator structure including a third piezoelectric layer on a third bottom metal contact, and a third top metal contact on the third piezoelectric layer.

Example 7 includes the subject matter of any of Examples 1-6, wherein the third piezoelectric layer has a third thickness that is distinct from the first thickness and the second thickness.

Example 8 includes the subject matter of any of Examples 1-7, wherein the first bottom metal contact and the second bottom metal contact include a same metal.

Example 9 includes the subject matter of any of Examples 1-8, wherein the first bottom metal contact and the second bottom metal contact include at least one of Tungsten (W) and Molybdenum (Mo).

Example 10 includes the subject matter of any of Examples 1-9, wherein the second top metal contact has a plurality of inter-digitated (IDT) electrodes.

Example 11 includes the subject matter of any of Examples 1-10, wherein the first bottom metal contact and the second bottom metal contact are bonded to the substrate.

Example 12 includes the subject matter of any of Examples 1-11, wherein the substrate includes a plurality of Bragg reflectors, and wherein the first bottom metal contact and the second bottom metal contact are bonded to at least one of the plurality of Bragg reflectors.

Example 13 includes the subject matter of any of Examples 1-12, wherein the substrate includes a bottom FBAR where a top electrode of the bottom FBAR comprises a bottom Bragg reflector of the plurality of Bragg reflectors.

Example 14 includes a radio frequency (RF) communications integrated circuit device comprising the integrated circuit resonator device of any of Examples 1-13.

Example 15 is an integrated circuit resonator device comprising: a substrate; a first resonator structure over a first portion of the substrate and comprising a first bottom metal contact, a first piezoelectric layer having a first thickness, and a first top metal contact; a second resonator structure over a second portion of the substrate and comprising a second bottom metal contact, a second piezoelectric layer having a second thickness that is thicker than the first thickness, and a second top metal contact; and wherein the first piezoelectric layer and the second piezoelectric layer are comprised of a group III-V single crystal semiconductor material.

Example 16 includes the subject matter of Example 15, wherein the first piezoelectric layer and the second piezoelectric layer are comprised of a same group III-V semiconductor material that includes at least one of: Aluminum Nitride (AlN) and Aluminum Scandium Nitride (AlScN).

Example 17 includes the subject matter of any of Examples 15-16, wherein the first piezoelectric layer and the second piezoelectric layer each includes a first Aluminum Nitride (AlN) layer and a second AlN layer on the first AlN layer, the second AlN layer being distinct from the first AlN layer.

Example 18 includes the subject matter of any of Examples 15-17, wherein the first piezoelectric layer and the second piezoelectric layer each includes a first single crystal Aluminum Nitride (AlN) layer, a second single crystal AlN layer on the first AlN layer, and a third polycrystalline AlN layer on the second single crystal AlN layer, each of the first, second, and third AlN layers being distinct from one another.

Example 19 includes the subject matter of any of Examples 15-18, wherein the first piezoelectric layer and the second piezoelectric layer each includes a first single crystal Aluminum Nitride (AlN) layer, a second polycrystalline AlN layer, and a third single crystal AlN layer on top of both the first single crystal AlN layer and the second polycrystalline AlN layer.

Example 20 includes the subject matter of any of Examples 15-19, further comprising a third resonator structure over a third portion of the substrate, the third resonator structure including a third piezoelectric layer on a third bottom metal contact, and a third top metal contact on the third piezoelectric layer.

Example 21 includes the subject matter of any of Examples 15-20, wherein the third piezoelectric layer has a third thickness that is distinct from the first thickness and the second thickness.

Example 22 includes the subject matter of any of Examples 15-21, wherein the first bottom metal contact and the second bottom metal contact are comprised of a same metal.

Example 23 includes the subject matter of any of Examples 15-22, wherein the first bottom metal contact and the second bottom metal contact are comprised of at least one of Tungsten (W) and Molybdenum (Mo).

Example 24 includes the subject matter of any of Examples 15-23, wherein the second top metal contact comprises a plurality of inter-digitated (IDT) electrodes.

Example 25 includes the subject matter of any of Examples 15-24, wherein the first bottom metal contact and the second bottom metal contact are bonded to the substrate.

Example 26 includes the subject matter of any of Examples 15-25, wherein the substrate includes a plurality of Bragg reflectors, and wherein the first bottom metal contact and the second bottom metal contact are bonded to at least one of the plurality of Bragg reflectors.

Example 27 includes the subject matter of any of Examples 15-26, wherein the substrate includes a bottom FBAR where a top electrode of the bottom FBAR comprises a bottom Bragg reflector of the plurality of Bragg reflectors.

Example 28 includes a radio frequency (RF) communications integrated circuit device comprising the integrated circuit resonator device of any of Examples 15-27.

Example 29 is a method of forming a resonator device, the method comprising: depositing insulation material on a first substrate and forming a trench therein; depositing a piezoelectric stack of group III-V semiconductor material in the trench and laterally over the insulation material to form a central portion, a first wing, and a second wing, the first and second wings extending from the central portion in opposite directions; transferring the piezoelectric stack onto a second substrate; removing the first substrate; removing the insulation material; depositing a first top electrode on the first wing to thereby form a first resonator structure; depositing a second top electrode on the second wing to thereby form a second resonator structure; and patterning a plurality of IDT electrodes on a top surface of the central portion to thereby form a third resonator structure.

Example 30 includes the subject matter of Example 29, wherein patterning the STI material comprises depositing a blanket layer of insulation material and etching the blanket layer of STI material to form the trench.

Example 31 includes the subject matter of any of Examples 29-30, wherein the depositing the piezoelectric stack comprises depositing a first low-temperature Aluminum Nitride (AlN) layer and depositing a second high-temperature AlN layer on the first low-temperature AlN layer.

Example 32 includes the subject matter of any of Examples 29-31, wherein the depositing the piezoelectric stack comprises depositing a first low-temperature single crystal Aluminum Nitride (AlN) layer, depositing a second high-temperature single crystal AlN layer on the first low-temperature single crystal AlN layer, and sputtering a third polycrystalline AlN layer on the second high-temperature single crystal AlN layer.

Example 33 includes the subject matter of any of Examples 29-32, wherein the depositing the piezoelectric stack comprises depositing a first low-temperature single crystal Aluminum Nitride (AlN) layer, sputtering a second polycrystalline AlN layer, and depositing a third high-temperature single crystal AlN layer on top of the first low-temperature single crystal AlN layer and the second polycrystalline AlN layer.

Example 34 includes the subject matter of any of Examples 29-33, wherein the depositing the first top electrode and the second top electrode are performed using atomic layer deposition (ALD).

Example 35 includes the subject matter of any of Examples 29-34, wherein the removing the insulation material is performed by etching out the insulation material.

Example 36 includes the subject matter of any of Examples 29-35, wherein transferring the piezoelectric stack onto the second substrate is carried out by bonding a surface of an intermediate integrated circuit structure that includes the piezoelectric stack to the second substrate.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
    a substrate;
    a first resonator structure over a first portion of the substrate, the first resonator structure including
        a first layer on a first bottom contact, the first layer having a first thickness, and the first layer having a vertical sidewall extending to a top of the first layer, wherein the first bottom contact extends along and is in contact with an entirety of the vertical sidewall of the first layer, and
        a first top contact on the first layer; and
    a second resonator structure over a second portion of the substrate, the second resonator structure including
        a second layer on a second bottom contact, the second layer having a second thickness that is thicker than the first thickness of the first layer, and
        a second top contact on the second layer;
    wherein a bottom surface of the first layer facing the first bottom contact is coplanar with a bottom surface of the second layer facing the second bottom contact,
    wherein a top surface of the first layer facing the first top contact is not coplanar with a top surface of the second layer facing the second top contact, and
    wherein the first layer and the second layer comprise a group III-V single crystal piezoelectric semiconductor material, and the first and second bottom contacts and the first and second top contacts each comprise metal.

2. The integrated circuit of claim 1, further comprising a third resonator structure over a third portion of the substrate, the third resonator structure including a third layer on a third bottom contact, and a third top contact on the third layer, and the third bottom contact and the third top contact each comprises metal.

3. The integrated circuit of claim 2, wherein the third layer has a third thickness that is thinner than the second thickness.

4. The integrated circuit of claim 1, wherein the first bottom contact and the second bottom contact comprise a same metal.

5. The integrated circuit of claim 4, wherein the first bottom contact and the second bottom contact comprise at least one of Tungsten (W) and Molybdenum (Mo).

6. The integrated circuit of claim 1, wherein the group III-V single crystal piezoelectric semiconductor material includes nitrogen and at least one of: aluminum and scandium.

7. The integrated circuit of claim 1, wherein the group III-V single crystal piezoelectric semiconductor material includes nitrogen and aluminum, and the first layer and the second layer each are part of a multilayer structure that includes a first Aluminum Nitride (AlN) layer and a second AlN layer on the first AlN layer, the second AlN layer being distinct from the first AlN layer.

8. The integrated circuit of claim 1, wherein the group III-V single crystal piezoelectric semiconductor material includes nitrogen and aluminum, and wherein the first layer and the second layer each are part of a multilayer structure that includes a first single crystal Aluminum Nitride (AlN) layer, a second single crystal AlN layer on the first AlN layer, and a third polycrystalline AlN layer on the second single crystal AlN layer, each of the first, second, and third AlN layers being distinct from one another.

9. The integrated circuit of claim 1, wherein the group III-V single crystal piezoelectric semiconductor material includes nitrogen and aluminum, and wherein the first layer and the second layer each are part of a multilayer structure that includes a first single crystal Aluminum Nitride (AlN) layer, a second polycrystalline AlN layer, and a third single crystal AlN layer on top of both the first single crystal AlN layer and the second polycrystalline AlN layer.

10. The integrated circuit of claim 1, wherein the second top contact comprises a plurality of inter-digitated (IDT) electrodes.

11. An integrated circuit comprising:
a substrate;
a first resonator structure over a first portion of the substrate and comprising a first bottom contact, a first layer having a first thickness, and a first top contact, and the first layer having a vertical sidewall extending to a top of the first layer, wherein the first bottom contact extends along and is in contact with an entirety of the vertical sidewall of the first layer; and
a second resonator structure over a second portion of the substrate and comprising a second bottom contact, a second layer having a second thickness that is thicker than the first thickness, and a second top contact;
wherein a first section of the first bottom contact is in contact with a bottom surface of the first layer, and a second section of the first bottom contact is in contact with a side surface of the first layer; and
wherein the first layer and the second layer comprise a group III-V single crystal piezoelectric semiconductor material.

12. The integrated circuit of claim 11, further comprising a third resonator structure over a third portion of the substrate, the third resonator structure including a third layer on a third bottom contact, and a third top contact on the third layer.

13. The integrated circuit of claim 12, wherein the third layer has a third thickness that is thinner than the second thickness.

14. The integrated circuit of claim 11, wherein the group III-V single crystal piezoelectric semiconductor material includes nitrogen and at least one of: aluminum and scandium.

15. The integrated circuit of claim 11, wherein the first bottom contact and the second bottom contact comprise at least one of Tungsten (W) and Molybdenum (Mo), and wherein the second top contact comprises a plurality of inter-digitated (IDT) electrodes.

16. The integrated circuit of claim 11, wherein the first layer and the second layer are separated by one or more insulating materials.

17. An integrated circuit comprising:
a body of a group III-V piezoelectric semiconductor material extending in a lateral direction, the body including a first portion, a second portion, and a third portion, the second portion laterally between the first and third portions, the first and third portions each having a maximum thickness less than a maximum thickness of the second portion;
a first resonator structure including the first portion of the body on a first bottom contact, and a first top contact on the first portion of the body, and the first portion of the body having a vertical sidewall extending to a top of the first portion of the body, wherein the first bottom contact extends along and is in contact with an entirety of the vertical sidewall of the first portion of the body;
a second resonator structure including the second portion of the body on a second bottom contact, and a second top contact on the second portion of the body; and
a third resonator structure including the third portion of the body on a third bottom contact, and a third top contact on the third portion of the body, and the third portion of the body having a vertical sidewall extending to a top of the third portion of the body, wherein the third bottom contact extends along and is in contact with an entirety of the vertical sidewall of the third portion of the body,
wherein the first portion, the second portion, and the third portion are discontinuous portions that are separated by corresponding one or more insulating materials, and
wherein the first resonator, the second resonator, and the third resonator are on a shared substrate.

18. The integrated circuit of claim 17, wherein:
the first top contact is on a top surface of the first portion of the body, the second top contact is on a top surface of the second portion of the body, and the third top contact is on a top surface of the third portion of the body.

19. The integrated circuit of claim 18, wherein the second top contact comprises a plurality of inter-digitated (IDT) electrodes.

20. A radio frequency (RF) communications integrated circuit comprising the integrated circuit of claim 17.

21. An integrated circuit comprising:
a substrate;
a first resonator structure over a first portion of the substrate, the first resonator structure including
a first layer on a first bottom contact, the first layer having a first thickness, and
a first top contact on the first layer; and
a second resonator structure over a second portion of the substrate, the second resonator structure including
a second layer on a second bottom contact, the second layer having a second thickness that is thicker than the first thickness of the first layer, and
a second top contact on the second layer;

wherein a bottom surface of the first layer facing the first bottom contact is coplanar with a bottom surface of the second layer facing the second bottom contact, wherein a top surface of the first layer facing the first top contact is not coplanar with a top surface of the second layer facing the second top contact, and wherein the first layer and the second layer comprise a group III-V single crystal piezoelectric semiconductor material, and the first and second bottom contacts and the first and second top contacts each comprise metal, wherein the group III-V single crystal piezoelectric semiconductor material includes nitrogen and aluminum, and wherein the first layer and the second layer each are part of a multilayer structure that includes a first single crystal Aluminum Nitride (AlN) layer, a second single crystal AlN layer on the first AlN layer, and a third polycrystalline AlN layer on the second single crystal AlN layer, each of the first, second, and third AlN layers being distinct from one another.

22. An integrated circuit comprising:

a substrate;

a first resonator structure over a first portion of the substrate, the first resonator structure including
  a first layer on a first bottom contact, the first layer having a first thickness, and
  a first top contact on the first layer; and a second resonator structure over a second portion of the substrate, the second resonator structure including
  a second layer on a second bottom contact, the second layer having a second thickness that is thicker than the first thickness of the first layer, and
  a second top contact on the second layer;

wherein a bottom surface of the first layer facing the first bottom contact is coplanar with a bottom surface of the second layer facing the second bottom contact, wherein a top surface of the first layer facing the first top contact is not coplanar with a top surface of the second layer facing the second top contact, and wherein the first layer and the second layer comprise a group III-V single crystal piezoelectric semiconductor material, and the first and second bottom contacts and the first and second top contacts each comprise metal, wherein the group III-V single crystal piezoelectric semiconductor material includes nitrogen and aluminum, and wherein the first layer and the second layer each are part of a multilayer structure that includes a first single crystal Aluminum Nitride (AlN) layer, a second polycrystalline AlN layer, and a third single crystal AlN layer on top of both the first single crystal AlN layer and the second polycrystalline AlN layer.

* * * * *